(12) United States Patent
Hong et al.

(10) Patent No.: US 6,180,473 B1
(45) Date of Patent: Jan. 30, 2001

(54) METHOD FOR MANUFACTURING SEMICONDUCTOR DEVICE

(75) Inventors: Sung Kwon Hong; Jeong Hwan Son, both of Daejeon-si; Jae Gyung Ahn, Chungcheongbuk-do; Jeong Mo Hwang, Daejeon-si, all of (KR)

(73) Assignee: Hyundai Electroncis Industries Co., Ltd., Kyoungki-Do (KR)

( * ) Notice: Under 35 U.S.C. 154(b), the term of this patent shall be extended for 0 days.

(21) Appl. No.: 09/468,123

(22) Filed: Dec. 21, 1999

(30) Foreign Application Priority Data

Jun. 21, 1999 (KR) .................................................. 99-17862

(51) Int. Cl.[7] .................................................. H01L 21/336
(52) U.S. Cl. ........................ 438/303; 438/306; 438/595; 438/528
(58) Field of Search ..................................... 438/197, 303, 438/306, 585, 595, 528

(56) References Cited

U.S. PATENT DOCUMENTS

| | | | |
|---|---|---|---|
| 5,514,902 | * | 5/1996 | Kawasaki et al. .................... 257/607 |
| 5,554,871 | * | 9/1996 | Yamashita et al. ................... 257/336 |
| 5,872,049 | * | 2/1999 | Gardner et al. ....................... 438/585 |
| 5,926,729 | * | 7/1999 | Tsai et al. ............................. 438/585 |
| 5,937,301 | * | 8/1999 | Gardner et al. ....................... 438/303 |
| 6,054,357 | * | 4/2000 | Choi ...................................... 438/306 |

* cited by examiner

Primary Examiner—Trung Dang
(74) Attorney, Agent, or Firm—Morgan, Lewis & Bockius LLP

(57) ABSTRACT

A method for manufacturing a semiconductor device improves hot carrier characteristic in a device having a thick gate insulating film without being affected by short channel effect, thereby improving reliability of the device. The method for manufacturing a semiconductor device includes the steps of forming gate electrodes having gate insulating films of different thicknesses on a semiconductor substrate, implanting a low-concentration impurity ion into the semiconductor substrate at both sides of the gate electrodes, implanting a nitrogen ion into a portion, where the low-concentration impurity ion is implanted, in the gate insulating film relatively thicker than the other gate insulating film, forming sidewall spacers at both sides of the gate electrodes, and implanting a high-concentration source/drain impurity ion into the semiconductor substrate.

13 Claims, 6 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and more particularly, to a method for manufacturing MOSFET.

2. Background of the Related Art

Generally, with high packing density of a semiconductor device, there has been provided a method for simultaneously manufacturing devices having different functions or a method for forming a dual gate having gate insulating films of different thicknesses.

In manufacturing a device having gate insulating films of different thicknesses, it is most preferable that both a device having a thin gate insulating film and a device having a thick gate insulating film have desired characteristics at the same time.

A related art method for manufacturing a semiconductor device will be described with reference t o the accompanying drawings .

FIGS. 1a to 1d are sectional views illustrating a related art method for manufacturing a semiconductor device.

As shown in FIG. 1a, dual gate insulating films 13 and 13a are formed by a typical dual gate oxidation process and then gate electrodes 14 and 14a are formed. That is to say, a gate electrode 14 having a thin gate insulating film 13 and a gate electrode 14a having a relatively thick gate insulating film 13a are formed on a semiconductor substrate 11. A reference numeral 12 which is not described denotes a device isolation film.

Afterwards, as shown in FIG. 1b, lightly doped drain (LDD) regions 15 and 15a are formed into the semiconductor substrate 11 by low-concentration impurity ion implantation using the gate electrodes 14 and 14a as masks.

As shown in FIG. 1c, an insulating film is deposited on an entire surface of the semiconductor substrate 11 including the gate electrodes 14 and 14a. The insulating film is then etched back to form sidewall spacers 16 and 16a at both sides of the gate electrodes 14 and 14a.

As shown in FIG. 1d, source/drain impurity regions 17 and 17a are formed by high-concentration impurity ion implantation using the gate electrodes 14 and 14a and the sidewall spacers 16 and 16a as masks. As a result, the related art method for manufacturing a semiconductor device is completed.

However, the related art method for manufacturing a semiconductor device has several problems.

In case that the thin gate insulating film and the thick gate insulating film are formed at the same time, hot carrier life time characteristic becomes poorer in the device having the thick gate insulating film than the device having the thin gate insulating film, thereby reducing reliability of the device.

SUMMARY OF THE INVENTION

Accordingly, the present invention is directed to a method for manufacturing a semiconductor device that substantially obviates one or more of the problems due to limitations and disadvantages of the related art.

An object of the present invention is to provide a method for manufacturing a semiconductor device which improves hot carrier characteristic in a device having a thick gate insulating film without being affected by short channel effect, thereby improving reliability of the device.

Additional features and advantages of the invention will be set forth in the description which follows, and in part will be apparent from the description, or ray be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for manufacturing a semiconductor device according to the present invention includes the steps of forming gate electrodes having gate insulating films of different thicknesses on a semiconductor substrate, implanting a low-concentration impurity ion into the semiconductor substrate at both sides of the gate electrodes, implanting a nitrogen ion into a portion, where the low-concentration impurity ion is implanted, in the gate insulating film relatively thicker than the other gate insulating film, forming sidewall spacers at both sides of the gate electrodes, and implanting a high-concentration source/drain impurity ion into the semiconductor substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

In a method for manufacturing a semiconductor device according to the present invention, in order to form a device having a thin gate insulating film and a device having a thick gate insulating film, ion implantation is performed to form an LDD region and then a nitrogen ion is implanted into a semiconductor substrate at both sides of a gate electrode having a thick gate insulating film.

A method for manufacturing a semiconductor device according to the embodiments of the present invention will be described in detail.

Figure 1A:
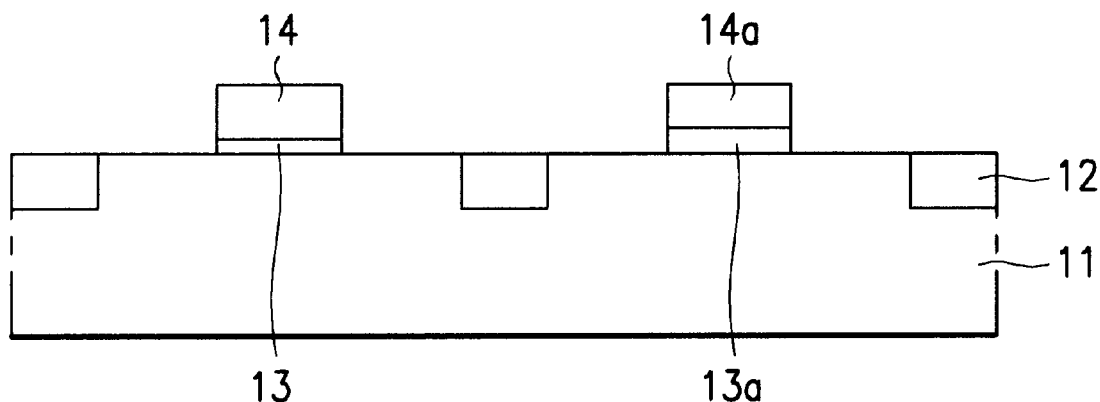
FIGS. 1a to 1d are sectional views illustrating a related art method for manufacturing a semiconductor device.
Figure 1B:
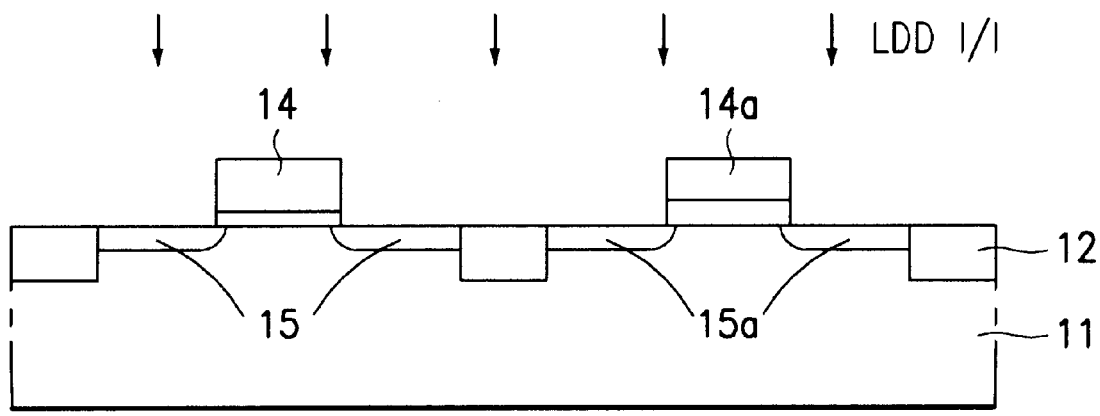
Figure 1C:
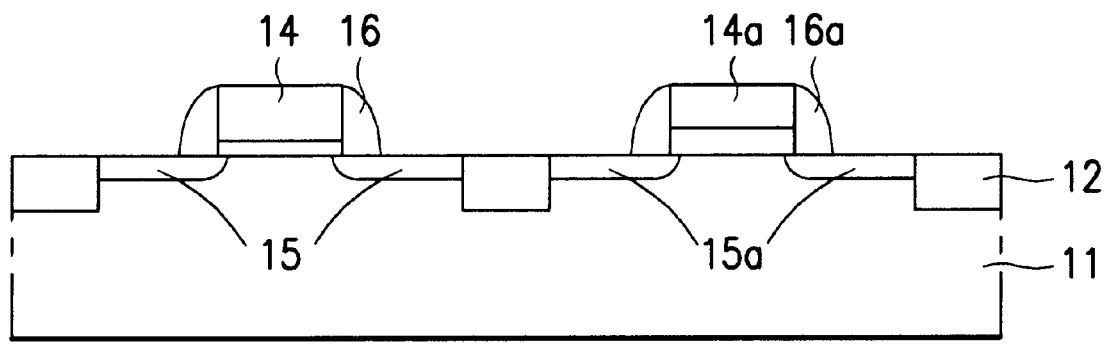
Figure 1D:
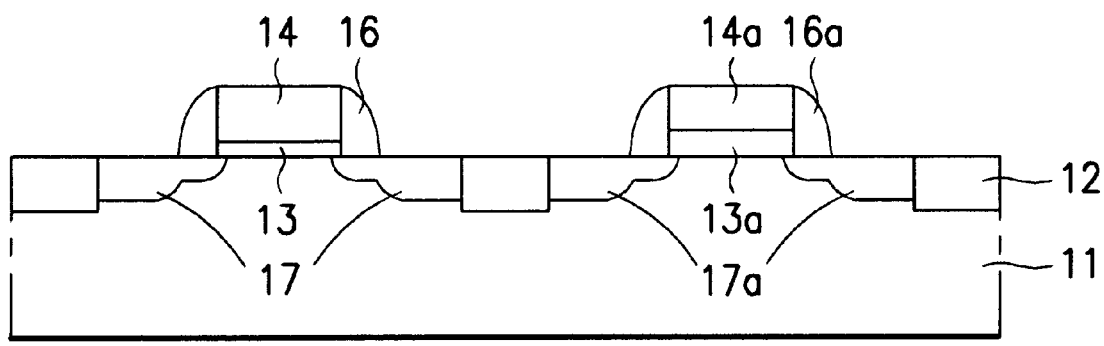
Figure 2A:
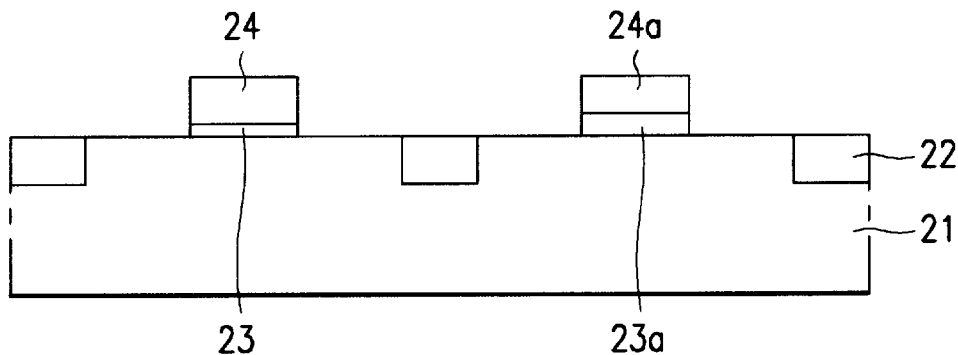
FIGS. 2a to 2c are sectional views illustrating a method for manufacturing a semiconductor device according to the first embodiment of the present invention.
Figure 2B:
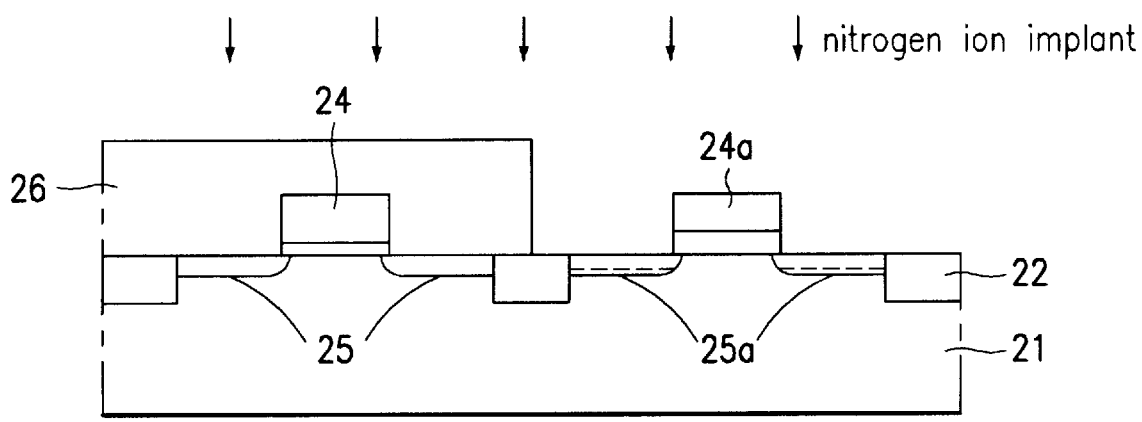
Figure 2C:
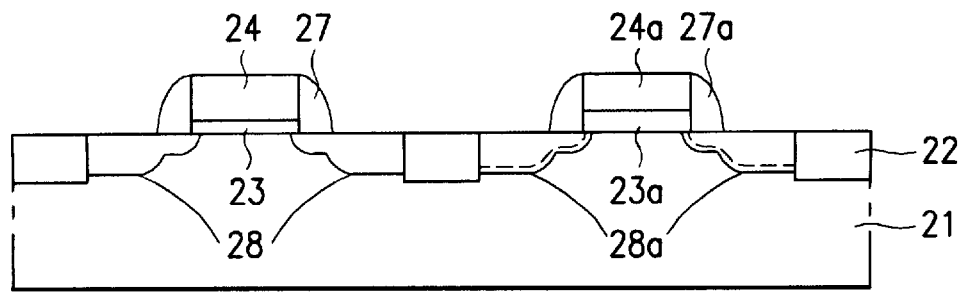

FIGS. 2a to 2c are sectional views illustrating a method for manufacturing a semiconductor device according to the first embodiment of the present invention.

As shown in FIG. 2a, gate electrodes 24 and 24a having different gate insulating films are formed on a semiconductor substrate 21. That is to say, a gate electrode 24 having a gate insulating film 23 of a first thickness and a gate electrode 24a having a gate insulating film 23a of a second thickness thicker than the first thickness are formed. At this time, the gate insulating films 23 and 23a of the first and second thicknesses are formed by a typical dual gate oxidation process. A reference numeral 22 which is not described denotes a device isolation film.

As shown in FIG. 2b, LDD regions 25 and 25a are formed into the semiconductor substrate 21 at both sides of the respective gate electrodes 24 and 24a by low-concentration impurity ion implantation using the gate electrodes 24 and 24a as masks.

Afterwards, a photoresist is deposited on an entire surface of the semiconductor substrate 21 including the gate electrodes 24 and 24a. The photoresist is then patterned to expose the gate electrode 24a having the gate insulating film 23a of the second thickness and the semiconductor substrate 21 at both sides of the gate electrode 24a, so that a mask pattern 26 is formed. A nitrogen ion is implanted into the exposed substrate 21 using the mask pattern 26 as a mask.

Subsequently, as shown in FIG. 2c, the mask pattern 26 is removed and then an insulating film is deposited on the entire surface of the substrate 21 including the respective gate electrodes 24 and 24a. The insulating film is then etched back to form sidewall spacers 27 and 27a at both sides of the respective gate electrodes 24 and 24a.

Finally, source/drain impurity regions 28 and 28a are formed by high-concentration impurity ion implantation using the gate electrodes 24 and 24a and the sidewall spacers 27 and 27a as masks. As a result, the method for manufacturing a semiconductor device according to the first embodiment of the present invention is completed.

In the aforementioned first embodiment of the present invention, the nitrogen ion implantation may be performed before forming the LDD regions 25 and 25a (not shown). That is to say, the gate electrodes 24 and 24a are formed and then the mask pattern 26 is formed to expose the gate electrode 24a having the gate insulating film 23a of the second thickness and the substrate 21 at both sides of the gate electrode 24a. The nitrogen ion is implanted into the exposed substrate 21 using the mask pattern 26 as a mask. Subsequently, the mask pattern 26 is removed and then an impurity ion is lightly implanted into the semiconductor substrate 21 at both sides of the respective gate electrodes 24 and 24a to form LDD regions 25 and 25a.

Figure 3A:
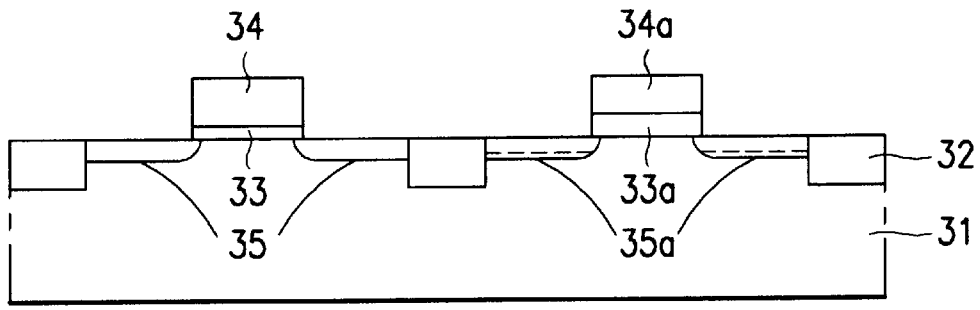
FIGS. 3a to 3c are sectional views illustrating a method for manufacturing a semiconductor device according to the second embodiment of the present invention.
Figure 3B:
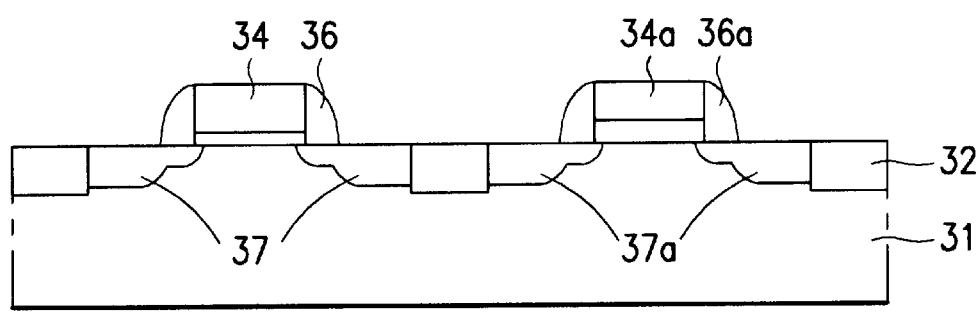
Figure 3C:
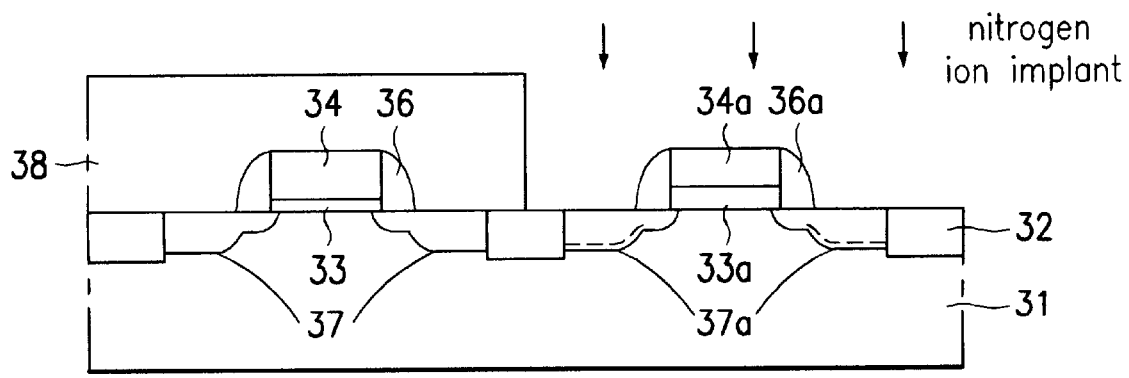

Meanwhile, FIGS. 3a to 3c are sectional views illustrating a method for manufacturing a semiconductor device according to the second embodiment of the present invention.

In the first embodiment of the present invention, nitrogen ion implantation is performed after forming the LDD regions. While, in the second embodiment of the present invention, nitrogen ion implantation is performed after forming source/drain impurity regions.

That is, as shown in FIG. 3a, a gate insulating film 33 of a first thickness and a second gate insulating film 33a of a second thickness are formed on a semiconductor substrate 31 by a typical dual gate oxidation process. Then, gate electrodes 34 and 34a are respectively formed on the gate insulating films 33 and 33a.

Afterwards, LDD regions 35 and 35a are formed by low-concentration impurity ion implantation using the gate electrodes 34 and 34a as masks.

A reference numeral 32 which is not described denotes a device isolation film.

As shown in FIG. 3b, an insulating film is deposited on an entire surface of the substrate 31 including the respective gate electrodes 34 and 34a. The insulating film is then etched back to form sidewall spacers 36 and 36a at both sides of the respective gate electrodes 34 and 34a. Source/drain impurity regions 37 and 37a are formed by high-concentration impurity ion implantation using the gate electrodes 34 and 34a and the sidewall spacers 36 and 36a as masks.

Subsequently, as shown in FIG. 3c, a photoresist is deposited on the entire surface of the semiconductor substrate 31 including the gate electrodes 34 and 34a. The photoresist is then patterned to form a mask pattern 38 for masking both the gate electrode 34 having the insulating film 33 of the first thickness and the substrate 31 at both sides of the gate electrode 34.

A nitrogen ion is implanted into the substrate 21 at both sides of the gate electrode 34a having the gate insulating film 33a of the second thickness using the mask pattern 38 as a mask. As a result, the method for manufacturing a semiconductor device according to the second embodiment of the present invention is completed.

In the aforementioned second embodiment of the present invention, the nitrogen ion implantation may be performed before forming the source/drain impurity regions 37 and 37a (not shown). That is to say, the sidewall spacers 36 and 36a are formed and then the mask pattern 38 for masking the gate electrode 34 having the gate insulating film 33 of the first thickness and the substrate 31 at both sides of the gate electrode 34 is formed. The nitrogen ion is implanted into the substrate 31 at both sides of the gate electrode 34a having the gate insulating film 33a of the second thickness using the mask pattern 38 as a mask. Subsequently, the mask pattern 38 is removed and then the source/drain impurity regions 37 and 37a are formed by high-concentration impurity ion implantation.

Figure 4A:
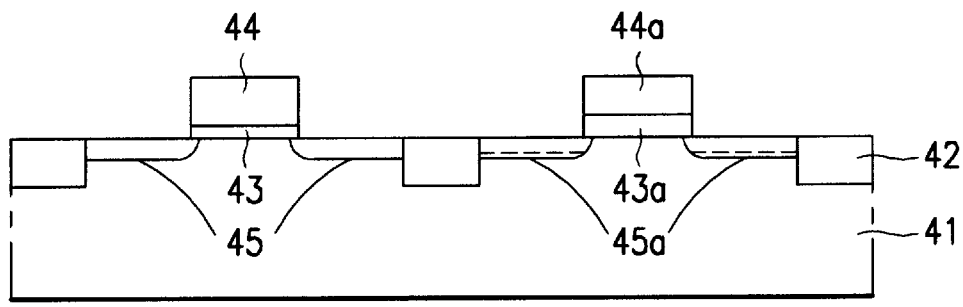
FIGS. 4a to 4c are sectional views illustrating a method for manufacturing a semiconductor device according to the third embodiment of the present invention.
Figure 4B:
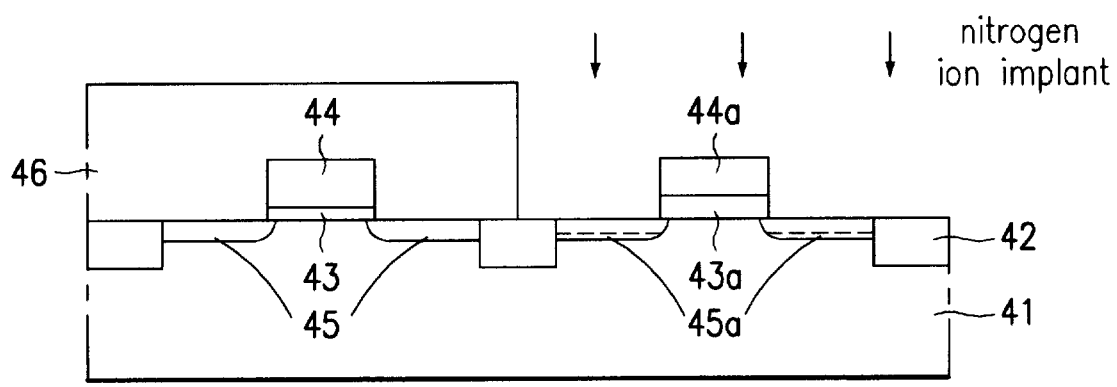
Figure 4C:
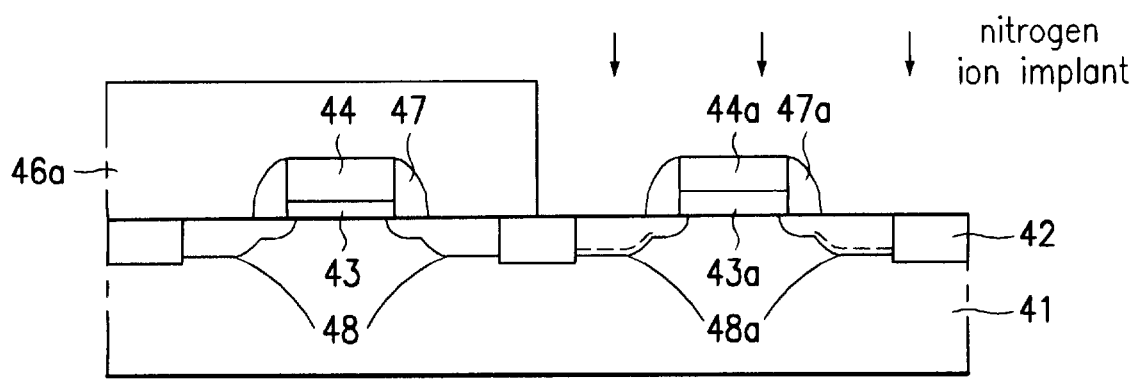

FIGS. 4a to 4c are sectional views illustrating a method for manufacturing a semiconductor device according to the third embodiment of the present invention.

In the third embodiment of the present invention, nitrogen ion implantation is twice performed.

As shown in FIG. 4a, a gate insulating film 43 of a first thickness and a second gate insulating film 43a of a second thickness are formed on a semiconductor substrate 41 by a typical dual gate oxidation process. Then, gate electrodes 44 and 44a are respectively formed on the gate insulating films 43 and 43a.

Afterwards, LDD regions 45 and 45a are formed into the substrate 41 at both sides of the respective gate electrodes 44 and 44a by low-concentration impurity ion implantation.

A reference numeral 42 which is not described denotes a device isolation film.

As shown in FIG. 4b, a photoresist is deposited on an entire surface of the semiconductor substrate 41 including the gate electrodes 44 and 44a. The photoresist is then patterned to form a first mask pattern 46 for masking both the gate electrode 44 having the insulating film 43 of the first thickness and the substrate 41 at both sides of the gate electrode 44.

A nitrogen ion is primarily implanted into the substrate 41 at both sides of the gate electrode 44a having the gate insulating film 43a of the second thickness using the first mask pattern 46 as a mask.

Afterwards, as shown in FIG. 4c, the first mask pattern 46 is removed and an insulating film is deposited on the entire surface of the substrate 41 including the respective gate electrodes 44 and 44a. The insulating film is then etched back to form sidewall spacers 47 and 47a at both sides of the respective gate electrodes 44 and 44a. Source/drain impurity regions 48 and 48a are formed into the substrate 41 at both sides of the respective gate electrodes 44 and 44a by high-concentration impurity ion implantation using the gate electrodes 44 and 44a and the sidewall spacers 47 and 47a as masks.

Subsequently, a photoresist is deposited on the entire surface of the semiconductor substrate 41 including the gate electrodes 44 and 44a. The photoresist is then patterned to form a second mask pattern 46a for masking both the gate electrode 44 having the insulating film 43 of the first thickness and the substrate 41 at both sides of the gate electrode 44.

The nitrogen ion is secondarily implanted into the substrate 41 at both sides of the gate electrode 44a having the gate insulating film 43a of the second thickness using the second mask pattern 46a as a mask. As a result, the method for manufacturing a semiconductor device according to the third embodiment of the present invention is completed.

In the third embodiment of the present invention, the primary nitrogen ion implantation may be performed before forming the LDD regions 45 and 45a and the secondary nitrogen ion implantation may be performed before forming the source/drain impurity regions 48 and 48a. That is to say, before forming the LDD regions 45 and 45a, the first mask pattern 46 is formed to expose the gate electrode 44a having the gate insulating film 43a of the second thickness and the substrate 41 at both sides of the gate electrode 44a. Then, the nitrogen ion is primarily implanted into the exposed substrate 41. Thereafter, the first mask pattern 46 is removed and then the LDD regions 45 and 45a are formed into the substrate 41 at both sides of the respective gate electrodes 44 and 44a by low-concentration ion implantation. The sidewall spacers 47 and 47a are formed and the second mask pattern 46a is formed to expose the gate electrode 44a having the gate insulating film 43a of the second thickness and the substrate 41 at both sides of the gate electrode 44a. The nitrogen ion is then secondarily implanted into the exposed substrate 41.

Afterwards, the second mask pattern 46a is removed and then source/drain impurity regions 48 and 48a are formed into the substrate 41 at both sides of the respective gate electrodes 44 and 44a by high-concentration ion implantation (not shown).

Figure 5:
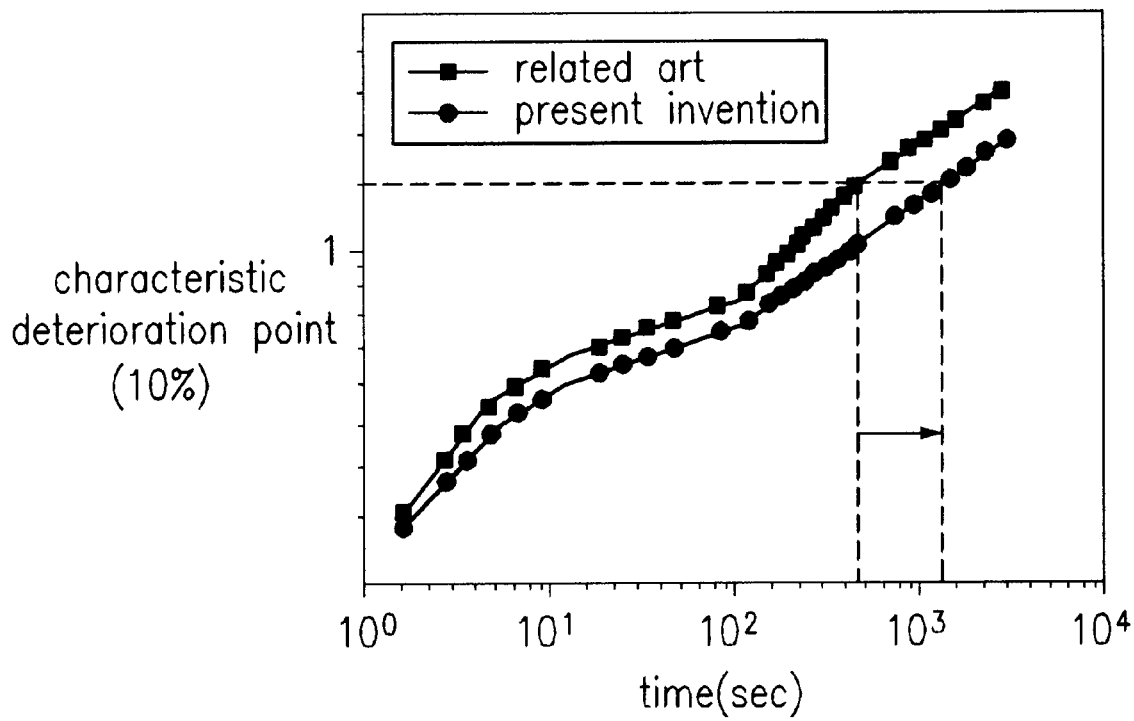
FIG. 5 shows graphs illustrating hot carrier life time according to a method for manufacturing a semiconductor device of the present invention in comparison with the related art.
Figure 5:
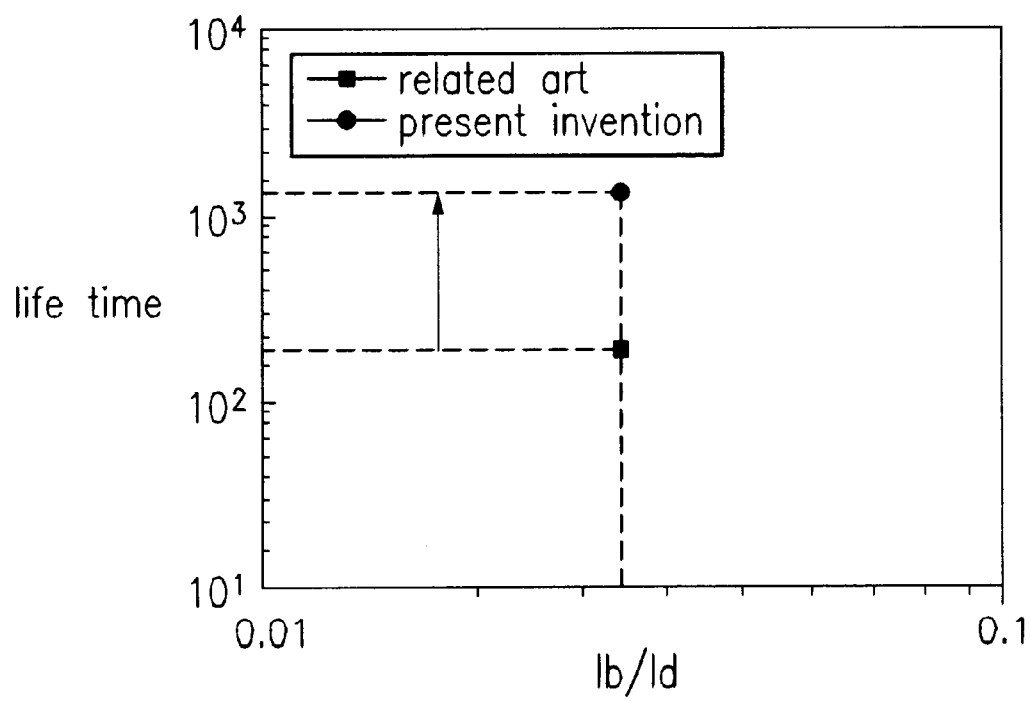

Meanwhile, FIG. 5 shows comparisons between the related art and the present invention in hot carrier generating time by normalizing hot carrier generating time in particular, in hot carrier life time of the device in which the thick gate insulating film is formed.

As shown in FIG. 5, in the present invention, if the nitrogen ion is implanted into the substrate in which the thick gate insulating film is formed, it is noted that hot carrier characteristic occurs later than the related art.

In other words, in case of characteristic deterioration by about 10%, characteristic deterioration occurs on the temporal axis less than $10^3$ in the related art while characteristic deterioration occurs on the temporal axis more than $10^3$ in the present invention.

Accordingly, in view of normalized hot carrier generating time, it is noted that life time of the device in the present invention become longer than that in the related art.

As aforementioned, the method for manufacturing the semiconductor device has the following advantages.

Since the nitrogen ion is implanted into the LDD regions and source/drain regions of the device having the thick gate insulating film, it is possible to improve hot carrier life time by the nitrogen ion, thereby increasing life time of the device.

It will be apparent to those skilled in the art that various modifications and variations can be made in the method for manufacturing a semiconductor device according to the present invention without departing from the spirit or scope of the invention. Thus, it is intended that the present invention covers the modifications and variations of the invention provided they come within the scope of the appended claims and their equivalents.

What is claimed is:

1. A method for manufacturing a semiconductor device comprising the steps of:

forming gate electrodes having gate insulating films of different thicknesses on a semiconductor substrate;

implanting a low-concentration impurity ion into the semiconductor substrate at both sides of the gate electrodes;

implanting a nitrogen ion into a portion, where the low-concentration impurity ion is implanted, in the gate insulating film relatively thicker than the other gate insulating film;

forming sidewall spacers at both sides of the gate electrodes; and implanting a high-concentration source/drain impurity ion into the semiconductor substrate.

2. The method for manufacturing a semiconductor device as claimed in claim 1, wherein the step of implanting the nitrogen ion is performed before implanting the low-concentration impurity ion.

3. A method for manufacturing a semiconductor device comprising the steps of:

forming a gate electrode having a gate insulating film of a first thickness and another gate electrode having a gate insulating film of a second thickness on a semiconductor substrate, the first and second thicknesses being different;

implanting a low-concentration impurity ion into the semiconductor substrate using the gate electrodes as masks;

implanting a nitrogen ion into the substrate at both sides of the gate electrode having the gate insulating film of the second thickness;

forming sidewall spacers at both sides of the gate electrodes; and forming source/drain impurity regions into the substrate at both sides of the gate electrodes.

4. The semiconductor device as claimed in claim 3, wherein the step of implanting the nitrogen ion is performed before implanting the low-concentration impurity ion.

5. A method for manufacturing a semiconductor device comprising the steps of:

forming a gate electrode having a gate insulating film of a first thickness and another gate electrode having a gate insulating film of a second thickness on a semiconductor substrate;

implanting a low-concentration impurity ion into semiconductor substrate using the gate electrodes as masks to form LDD regions;

forming a mask pattern for masking the gate electrode having the gate insulating film of the first thickness and the substrate at both sides thereof;

implanting a nitrogen ion into the substrate at both sides of the gate electrode having the gate insulating film of the second thickness using the mask pattern as a mask; and removing the mask pattern and implanting a high-concentration impurity ion into the substrate at both sides of the gate electrodes to form source/drain impurity regions.

6. The method for manufacturing a semiconductor device as claimed in claim 5, wherein the step of implanting the nitrogen ion is performed before forming the LDD regions.

7. The method for manufacturing a semiconductor device as claimed in claim 5, wherein the mask pattern is a photoresist.

8. A method for manufacturing a semiconductor device comprising the steps of:

forming a gate electrode having a gate insulating film of a first thickness and another gate electrode having a gate insulating film of a second thickness on a semiconductor substrate, the first and second thicknesses being different;

implanting a low-concentration impurity ion into the semiconductor substrate using the gate electrodes as masks;

forming sidewall spacers at both sides of the gate electrodes;

forming source/drain impurity regions into the substrate at both sides of the gate electrodes; and implanting a nitrogen ion into the substrate at both sides of the gate electrode having the gate insulating film of the second thickness.

9. The semiconductor device as claimed in claim 8, wherein the step of implanting the nitrogen ion is performed before forming the source/drain impurity regions.

10. A method for manufacturing a semiconductor device comprising the steps of:

forming a gate electrode having a gate insulating film of a first thickness and another gate electrode having a gate insulating film of a second thickness on a semiconductor substrate;

implanting a low-concentration impurity ion into semiconductor substrate using the gate electrodes as masks to form LDD regions;

forming a first mask pattern for masking the gate electrode having the gate insulating film of the first thickness and the substrate at both sides of the gate electrode;

primarily implanting a nitrogen ion into the substrate at both sides of the gate electrode having the gate insulating film of the second thickness using the first mask pattern as a mask;

removing the first mask pattern and implanting a high-concentration impurity ion into the substrate at both sides of the gate electrodes to form source/drain impurity regions;

forming a second mask pattern for masking the gate electrode having the gate insulating film of the second thickness and the substrate at both sides of the gate electrode; and secondarily implanting the nitrogen ion into the substrate at both sides of the gate electrode having the gate insulating film of the second thickness using the second mask pattern as a mask.

11. The method for manufacturing a semiconductor device as claimed in claim 10, wherein the step of primarily implanting the nitrogen ion is performed before forming the LDD regions.

12. The method for manufacturing a semiconductor device as claimed in claim 10, wherein the step of secondarily implanting the nitrogen ion is performed before implanting the source/drain impurity ion.

13. The method for manufacturing a semiconductor device as claimed in claim 10, wherein the first and second mask patterns are photoresists.

* * * * *